United States Patent
Matsunami et al.

(10) Patent No.: US 6,970,715 B2
(45) Date of Patent: Nov. 29, 2005

(54) PORTABLE WIRELESS TRANSCEIVER CONTROLLING TRANSMISSION POWER

(75) Inventors: Yoshinori Matsunami, Hyogo (JP);
Hiroaki Nagano, Hyogo (JP);
Shinjirou Fukuyama, Hyogo (JP);
Mitsuru Mochizuki, Hyogo (JP);
Kazuhito Niwano, Hyogo (JP);
Hirokazu Shimizu, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 301 days.

(21) Appl. No.: 10/333,907

(22) PCT Filed: Aug. 1, 2001

(86) PCT No.: PCT/JP01/06637
§ 371 (c)(1),
(2), (4) Date: Jan. 31, 2003

(87) PCT Pub. No.: WO03/015294
PCT Pub. Date: Feb. 20, 2003

(65) Prior Publication Data
US 2003/0157956 A1  Aug. 21, 2003

(51) Int. Cl.[7] .............................................. H04Q 7/20
(52) U.S. Cl. ................... 455/522; 455/67.11; 455/63.1
(58) Field of Search .............................. 455/522, 500, 455/115.1, 67.11, 67.13, 63.1, 68, 69, 126, 455/127.1

(56) References Cited

U.S. PATENT DOCUMENTS

| 6,304,749 B1 * | 10/2001 | Obara ......................... 455/126 |
| 6,405,057 B1 * | 6/2002 | Wright ........................ 455/561 |
| 6,591,089 B1 * | 7/2003 | Ichihara ..................... 455/115.3 |
| 2001/0006888 A1 * | 7/2001 | Posti et al. ................... 455/69 |
| 2002/0119797 A1 * | 8/2002 | Woodhead et al. ......... 455/522 |
| 2004/0176044 A1 * | 9/2004 | Wells et al. .................. 455/69 |

FOREIGN PATENT DOCUMENTS

| CN | 1237834 | 12/1999 |
| GB | 2336484 | 10/1999 |
| JP | 6-216788 | 8/1994 |
| JP | 7-212254 | * 8/1995 |

* cited by examiner

Primary Examiner—Nick Corsaro
Assistant Examiner—Edan Orgad
(74) Attorney, Agent, or Firm—Oblon, Spivak, McClelland, Maier & Neustadt, P.C.

(57) ABSTRACT

In the portable telephone of the present invention, a transmission power upper limit value (STEPLIM) in accordance with temperature (T) is found (S1, S2), whether the transmission power set value (STEPn) of the next slot exceeds the upper limit (STEPLIM) or not is determined (S3, S4), and when it does not exceed, a control signal value (Vc) in accordance with the transmission power set value (STEPn) is applied to a variable gain block (11, 13) (S5, S7). When it exceeds the upper limit, a control signal value (Vc) in accordance with the transmission power upper limit value (STEPLIM) is applied to the variable gain block (11, 13) (S6, S7).

6 Claims, 7 Drawing Sheets

FIG.2B  TABLE B

| T(C) | STEPLIM |
|------|---------|
| 60   | 1       |
| 50   | 2       |
| 40   | 2       |
| 30   | 3       |
| 20   | 3       |
| 10   | 4       |
| 0    | 4       |
| -10  | 5       |
| -20  | 5       |

FIG.2A  TABLE A

| STEP | Vc | Pout (dBm) |
|------|----|-----------|
| 0    | V0 | 27        |
| 1    | V1 | 26        |
| 2    | V2 | 25        |
| 3    | V3 | 24        |
| 4    | V4 | 23        |
| 5    | V5 | 22        |
| 6    | V6 | 21        |
| 7    | V7 | 20        |
| ---- | ---| ------    |

T=25°C

| Pout(dBm) | Vc(V) |
|---|---|
| 24 (Ps) | V1 |
| 23 | V2 |
| 22 | V3 |
| ⋮ | ⋮ |

→

T=40°C

| Pout(dBm) | Vc(V) |
|---|---|
| 24 (Ps) | V1+α |
| 23 | V2+α |
| 22 | V3+α |
| ⋮ | ⋮ |

PORTABLE WIRELESS TRANSCEIVER CONTROLLING TRANSMISSION POWER

TECHNICAL FIELD

The present invention relates to a portable wireless transceiver and, more specifically, to a portable wireless transceiver controlling transmission power in accordance with an instruction from a base station.

BACKGROUND ART

Conventionally, transmission power of a portable telephone is controlled at an optimal value up to the maximum transmission power Pmax (for example 25 dBm) in accordance with the position of the portable telephone, for example, so as to allow communication with a base station and not to hinder communication of other portable telephone with the base station. The amount of control per one slot of the transmission power Px is determined to be ±1 dB, ±2 dB, ±3 dB or the like, and accuracy of the amount of control ΔP is also determined to be 1 dB±0.5 dB, 2 dB±1 dB, 3 dB±1.5 dB, or the like.

Control of the transmission power of the portable telephone is realized by adjusting a control signal value Vc of a variable gain block. The portable telephone contains a storage unit, and in the storage unit, a table representing relation between transmission power set value Pout and the control signal value Vc when temperature T is 25° C. is stored, as shown in FIG. 7A. For example, assume that an instruction is issued from the base station to increase the transmission power by 1 dB, when the control signal value V2 is applied to the variable gain block and transmission is performed with transmission power set value Pout=23 dBm. In this case, the transmission power set value Pout is set to 24 dBm, by increasing the control signal value Vc to V1. The threshold power set value Ps is set to 24 dBm, and it is inhibited to set the transmission power set value Pout to be higher than the threshold power set value Ps.

When T=25° C., the transmission power set value Pout is equal to the actual transmission power Px. When the temperature T increases, however, the actual transmission power Px decreases even when the control signal value Vc is kept constant, as shown in FIG. 8. When the temperature T lowers, the actual transmission power Px increases, even when the control signal value Vc is kept constant. The reason for this is that the gain of the transmission system varies dependent on the temperature T.

In the example shown in FIG. 8, when T=40° C., by correcting the control signal value Vc to Vc+α, it is possible to compensate for the decrease in the transmission power Px. Therefore, conventionally, to the control signal value Vc read from the storage unit, a correction value a in accordance with the temperature T=40° C. is added as shown in FIG. 7B, and the corrected control signal value Vc+α is applied to the variable gain block, whereby change in transmission power Px resulting from the change in temperature is suppressed.

In the conventional method of power control, however, when power control (ΔP=1 dB) based on the instruction from the base station and power correction (ΔP') in accordance with the temperature T are performed simultaneously (time t1), the power control amount ΔP+ΔP' may undesirably exceed the accuracy specification (1 dB±0.5 dB), as shown in FIG. 9.

DISCLOSURE OF THE INVENTION

Therefore, an object of the present invention is to provide a portable wireless transceiver that can prevent the power control amount from exceeding the accuracy standard. The portable wireless transceiver in accordance with the present invention includes a receiving unit receiving a signal from a base station, a transmitting unit transmitting a signal to the base station with transmission power in accordance with a control signal value, a transmission power finding unit finding a control signal value that changes stepwise, corresponding to a transmission power request received from the base station through the receiving unit, a limit value determining unit detecting the state of the transmitting unit and determining a limit value for the control signal value changing stepwise based on the state, and a power control unit controlling transmission power of the transmitting unit in accordance with the control signal value found by the transmission power finding unit, and when the control signal value found by the transmission power finding unit exceeds the limit value of the limit value determining unit, the transmission power of the transmitting unit is controlled in accordance with the limit value. Therefore, it is not that the transmission power of the transmitting unit is corrected in accordance with the state of the transmitting unit, but that the limit value for the control signal value that changes stepwise is corrected. Therefore, unlike the prior art, it is not possible that the inherent power control and power correction in accordance with the state of the transmission unit are performed together resulting in a power control amount exceeding the accuracy specification.

Preferably, the limit value determining unit determines a limit value for the control signal that changes stepwise, based on the temperature of the transmitting unit. Here, it is not that the transmission power of the transmitting unit is corrected based on the temperature, but that the limit value for the control signal value that changes stepwise is corrected based on the temperature. Therefore, unlike the prior art, it is not possible that the inherent power control and temperature correction of the transmission power are performed together resulting in the power control amount exceeding the accuracy specification.

Preferably, the limit value determining unit determines the limit value for the control signal that changes stepwise, based on the temperature of the transmitting unit and a temperature-limit value table. Here, the limit value in accordance with the temperature of the transmitting unit can readily be determined.

Preferably, the limit value determining unit determines the limit value for the control signal value that changes step wise, based on the temperature of the transmitting unit and an expression representing relation between the temperature-limit value. Here again, the limit value in accordance with the temperature of the transmitting unit can readily be determined.

BRIEF DESCRIPTION OF THE DRAWINGS

FIGS. 2A and 2B represent tables stored in the storage unit shown in FIG. 1.

BEST MODE FOR CARRYING OUT THE INVENTION

Figure 1:
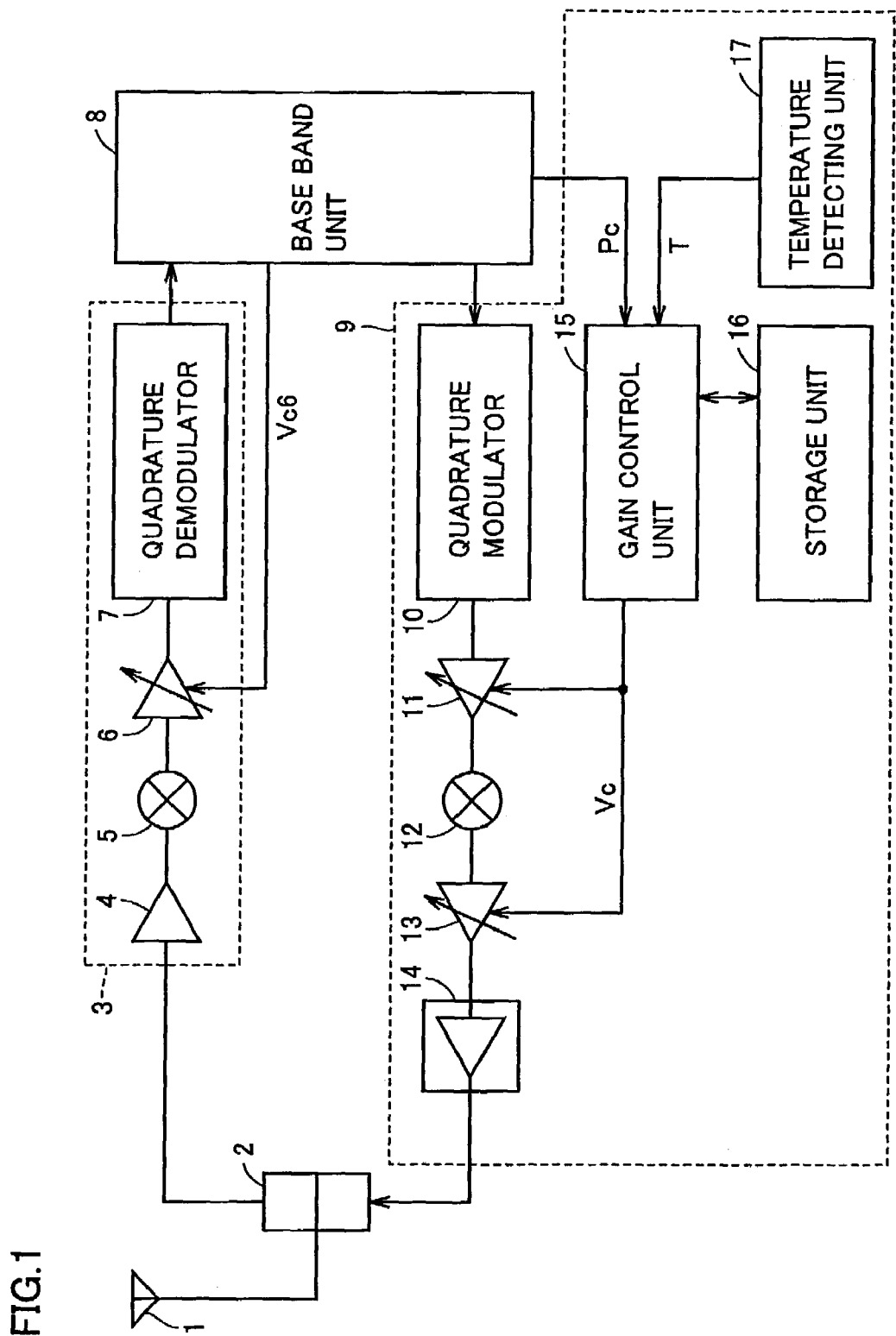
FIG. 1 is a block diagram representing a configuration of a portable telephone in accordance with an embodiment of the present invention.

FIG. 1 is a block diagram representing a main portion of a W-CDMA type portable telephone in accordance with one embodiment of the present invention. Referring to FIG. 1, the portable telephone includes an antenna 1, a duplexer 2, a receiving unit 3, a baseband unit 8 and a transmitting unit 9.

A high frequency signal transmitted from a base station and received by antenna 1 is input through duplexer 2 to receiving unit 3. Duplexer 2 prevents the received signal from entering transmitting unit 9, and to prevent a transmission signal from entering receiving unit 3. Receiving unit 3 includes a low noise amplifier 4, a mixer 5, a variable gain block 6 and a quadrature demodulator 7.

The high frequency signal input to receiving unit 3 is amplified by low noise amplifier 4, and applied to mixer 5. Mixer 5 mixes the input high frequency signal and an output signal of a local oscillator (not shown), and generates an IF signal. The IF signal is adjusted by variable gain block 6 to a prescribed power, and applied to quadrature demodulator 7. A control signal value Vc6 of variable gain block 6 is generated by baseband unit 8.

Quadrature demodulator 7 demodulates the IF signal to generate a baseband signal, which signal is applied to base band unit 8. The base band signal is demodulated at base band unit 8, converted to a digital signal and subjected to a prescribed processing, and converted, for example, to a voice signal.

On the contrary, a voice signal or the like is subjected to a prescribed processing and converted to a digital signal, the digital signal is modulated by baseband unit 8 to be converted to a baseband signal, and the baseband signal is input to transmitting unit 9. Transmitting unit 9 includes a quadrature modulator 10, variable gain blocks 11, 13, a mixer 12, a high power amplifier 14, a gain control unit 15, a storage unit 16 and a temperature detecting unit 17.

The baseband signal input to transmitting unit 9 is modulated by quadrature modulator 10 and converted to an IF signal. The IF signal is subjected to power adjustment at variable gain block 11, and applied to mixer 12. Mixer 12 mixes the input IF signal and an output signal of a local oscillator (not shown), to generate a high frequency signal. The high frequency signal is subjected to power adjustment at variable gain block 13, amplified by high power amplifier 14, and transmitted to the base station through duplexer 2 and antenna 1. Temperature detecting unit 17 detects the temperature T of transmitting unit 9, and applies the detected value to gain control unit 15.

Storage unit 16 stores a table A representing relation between step value STEP and a control signal value Vc when the temperature D is 25° C., as shown in FIG. 2A. In table A, control signal values Vc=V0, V1, V2, . . . are determined for respective step values STEP=0, 1, 2, . . . . Control signal values Vc=V0, V1, V2, . . . correspond to transmission power set values Pout=27, 26, 25, . . . (dBm), respectively. Specifically, when the step value STEP is incremented one by one, the transmission power set value Pout decrements 1 dB by 1 dB.

In storage unit 16, a table B representing relation between temperature T (° C.) and upper limit value STEPLIM of the step values STEP is stored, as shown in FIG. 2B. FIG. 2B shows that when temperature T increases through −20, 0, 20, 40, 60 (° C.), STEPLIM increases through 5, 4, 3, 2, 1. It is inhibited that the step value STEP is made smaller than the upper limit value STEPLIM.

Figure 3:
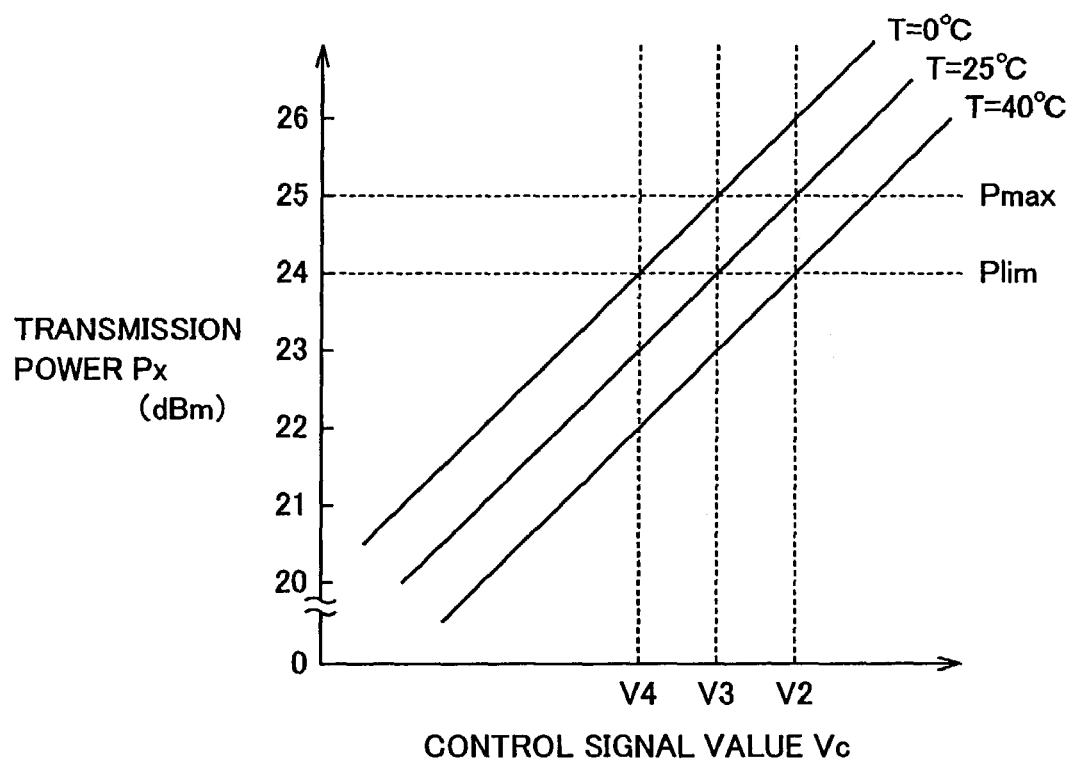
FIG. 3 shows the relation between each of control signal value Vc, transmission power Px and temperature T, shown in FIG. 1.

As shown in FIG. 3, it is assumed that when T=25° C., the transmission power set value Pout is equal to the actual transmission power Px, when T>25° C., Pout<Px, and when T<25° C., Pout>Px. Further, it is assumed that when T=40° C. and control signal value Vc is set to V2, the actual transmission power Px attains to the threshold power Plim, and when T=0° C. and Vc=V4, Px=Plim.

Returning to FIG. 1, gain control unit 15 finds the control signal Vc based on the power control signal Pc from base band unit 8, temperature detection value T from temperature detecting unit 17, and tables A and B stored in the storage unit 16, and applies the control signal value Vc to variable gain blocks 11 and 13 for controlling transmission power.

The method of transmission power control of the portable telephone will be described in the following. For communication with the base station, first, open loop control is performed. Specifically, base band unit 8 generates a control signal value Vc6 of variable gain block 6 so that a base band signal of a prescribed power will be input, calculates the received power from the base station based on the control signal value Vc6, and further based on the received power, calculates necessary transmission power. The smaller the received power, the larger the necessary transmission power. The larger the received power, the smaller the necessary transmission power. The transmission power is set to a minimum necessary power, so as not to hinder communication of other portable telephone. The maximum range of transmission power is determined to be 24 dBm−3 dB to 24 dBm+1 dB.

Base band unit 8 applies a power control signal Pc representing the calculated transmission power, to gain control unit 15. Gain control unit 15 reads the control signal value Vc which corresponds to the signal Pc from storage unit 16, and applies the control signal value Vc of the corresponding value to variable gain blocks 11, 13. Base band unit 8 waits for a reception acknowledge signal returned from the base station, and when the reception acknowledge signal is not returned, gradually increases the transmission power by a prescribed power at one time, until the acknowledge signal is received. When the reception acknowledge signal is returned from the base station, the open loop control ends, and inner loop control is performed.

In the inner loop control, increase/decrease of the transmission power is instructed from the base station to the portable telephone. This is to correct transmission power when the state of communication changes because of movement of the user of the portable telephone, for example. The amount of control of the transmission power includes three types, that is, ±1 dB, ±2 dB and ±3 dB. The accuracy standard of the control amount is determined to be 1 dB±0.5 dB, 2 dB±1 dB and 3 dB±1.5 dB. Further, DTX control is also known, in which transmission power is decreased by several dB, when voice is lost during voice communication. At the time of inner loop control, the power control signal Pc applied from the base band unit 8 to gain control unit 15 serves as a signal that represents the amount of increase/decrease of the transmission power.

Figure 4:
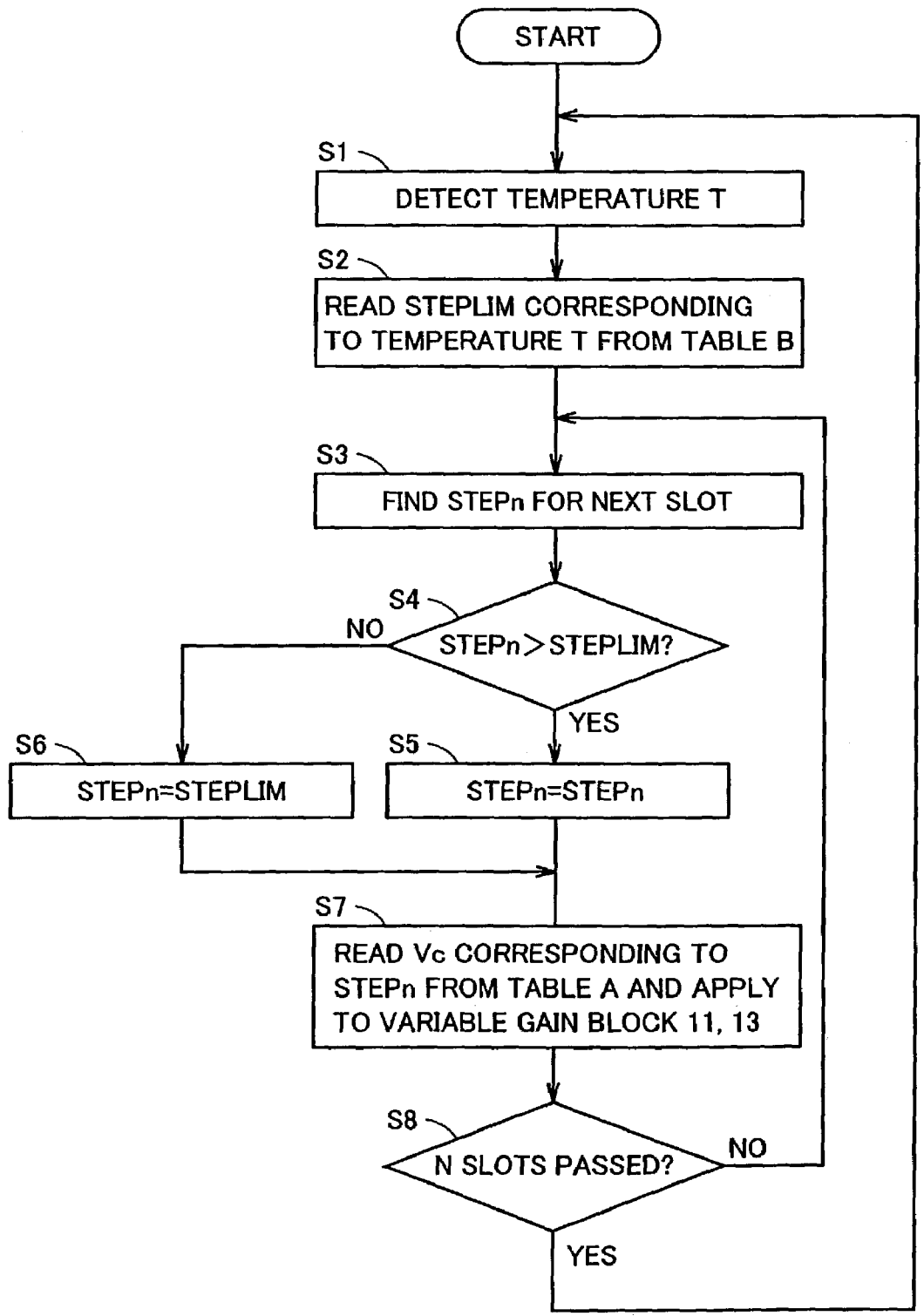
FIG. 4 is a flow chart representing an inner loop control of the portable telephone shown in FIG. 1.

FIG. 4 is a flow chart representing the inner loop control of the portable telephone shown in FIGS. 1 to 3. In FIG. 4, gain control unit 15 detects the temperature T of transmission unit 9 through temperature detecting unit 17 in step S1, and reads the step upper limit STEPLIM corresponding to the temperature T from table B of storage unit 16 in step S2.

Thereafter, in step S3, gain control unit 15 finds the step value STEPn of the next slot based on the power control signal Pc from base band unit 8, and in step S4, whether the step value STEPn of the next slot is larger than the upper limit value STEPLIM or not is determined.

Thereafter, when it is determined in step S4 that the step value STEPn is larger than the upper limit value STEPLIM, it means that the transmission power Px of the next slot does not exceed the threshold power Plim, and therefore gain control unit 15 sets, in step S5, the step value STEPn for the next slot to be the step value STEPn found in step S3. When it is determined in step S4 that the step value STEPn is not larger than the upper limit value STEPLIM, gain control unit 15 sets the step value STEPn for the next slot to be the upper limit value STEPLIM in step S6, so that the transmission power Px of the next slot does not exceed the threshold power Plim. Thereafter, in step S7, gain control unit 15 reads the control signal value Vc corresponding to the set step value STEPn from table A of storage unit 16, and applies the control signal value Vc to variable gain blocks 11, 13.

Thereafter, gain control unit 15 determines whether a predetermined number N of slots have passed or not in step S8, and when N slots have passed, the flow returns to step S1, and when N slots have not yet passed, the flow returns to step S3. This operation is based on the understanding that the temperature T of transmission unit 9 does not abruptly change, and therefore, detection of temperature T once in every N slots is sufficient.

Figure 5:
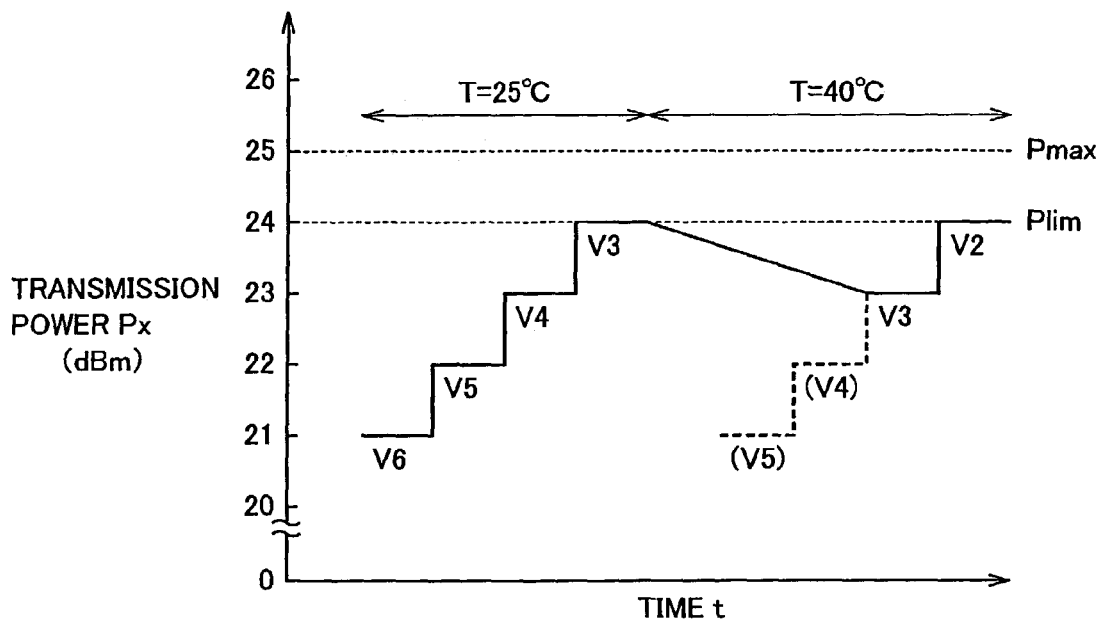
FIG. 5 is a time chart representing a specific example of the inner loop control shown in FIG. 4.

FIG. 5 is a time chart specifically representing the inner loop control shown in FIG. 4. When the portable telephone is used in the environment of T=25° C., the step upper limit value STEPLIM is set to 3. When it is instructed from the base station to increase the transmission power 1 dB by 1 dB, the control signal value Vc is increased stepwise to Vc=V3. When Vc=V3, the transmission power set value Pout attains to the threshold power Plim=24 dBm. It is noted that when T=25° C., Pout=Px.

When the portable telephone is to be used in the environment of T=40° C., the gain of transmitting unit 9 lowers so that transmission power Px lowers to 23 dBm, even when the control signal value Vc is kept at V3. The step upper limit value STEPLIM, however, is corrected to 2, and therefore, when it is instructed from the base station to increase the transmission power by 1 dB, the control signal value Vc is increased by one step to V2. Consequently, transmission power Px attains to 24 dBm. It is noted that when T=40° C., Pout=Px−1.

Figure 6:
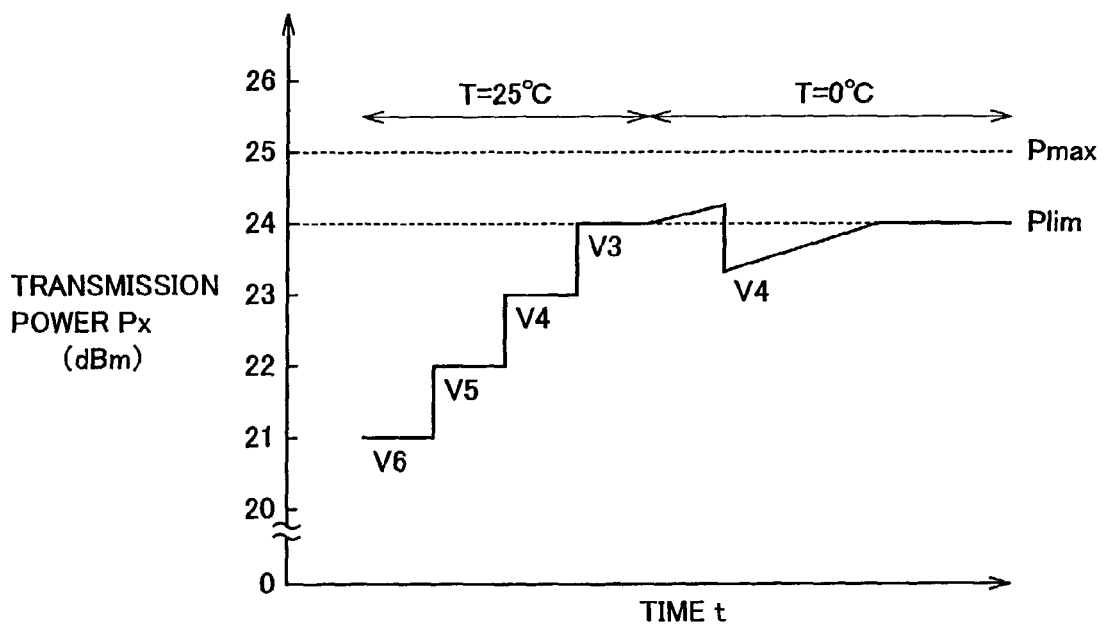
FIG. 6 is a time chart representing another specific example of the inner loop control shown in FIG. 4.
Figures 7A, 7B, 8:
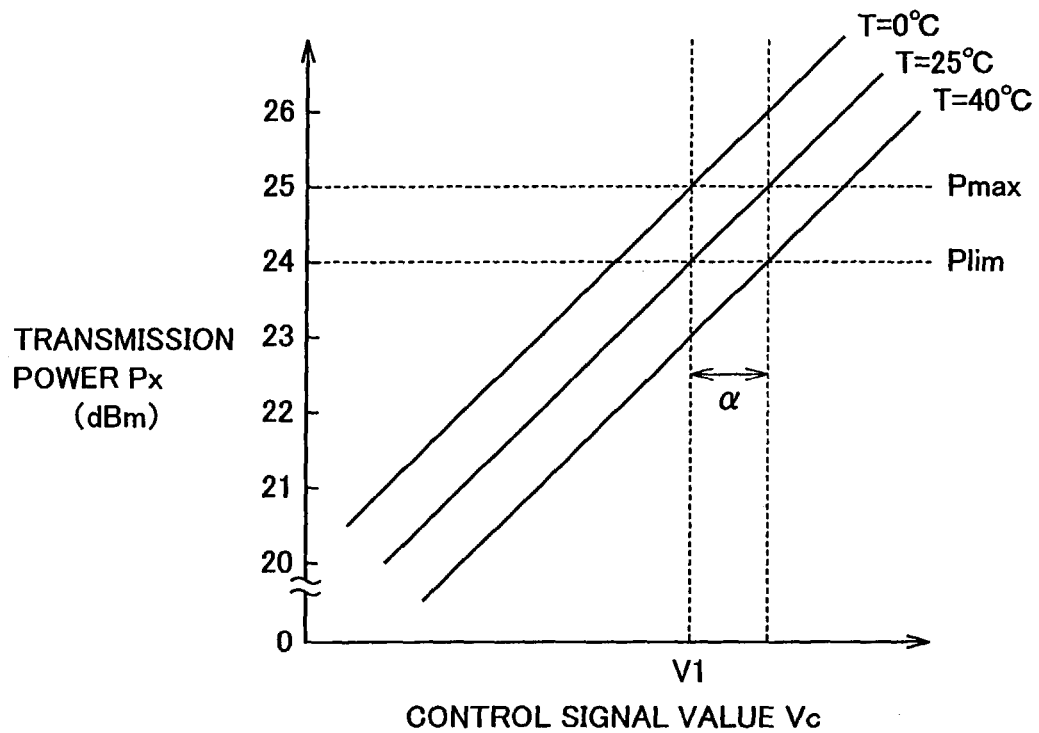
FIGS. 7A and 7B represent tables stored in the storage unit of a conventional portable telephone.
FIG. 8 shows the relation between each of control signal value Vc, transmission power Px and temperature T in the conventional portable telephone.
Figure 9:
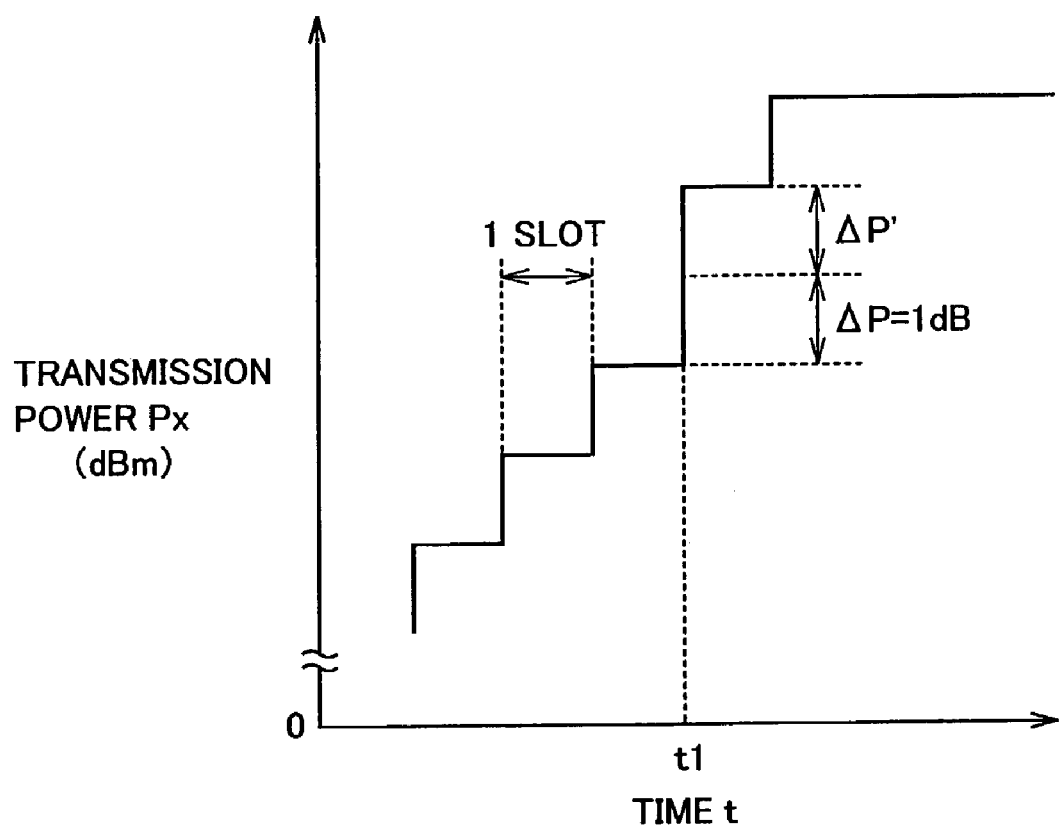
FIG. 9 is a time chart representing a problem in the inner loop control of the portable telephone.

FIG. 6 is another time chart specifically representing the inner loop control shown in FIG. 4. FIG. 6 shows an example in which the portable telephone is moved from the environment where T=25° C. to where T=0° C. When the portable telephone is moved from the environment of T=25° C. to T=0° C., the gain of transmitting unit 9 increases and transmission power Px increases gradually, even when control signal value Vc is kept at V3. The step upper limit STEPLIM, however, is corrected to 4, and therefore, in steps S3, S4 and S6 of FIG. 4, control signal value Vc is set to V4, and the transmission power Px is maintained to be not higher than the threshold power Plim. It is noted that when T=0° C., Pout=Px+1.

In the present embodiment, when the temperature T changes, not the control signal value Vc but the upper limit value thereof is corrected. Therefore, unlike the prior art, it is possible to prevent the inherent power control and correction of the control signal value Vc from being performed together to cause the power control amount ΔP to exceed accuracy specification of the inner loop control.

In the present embodiment, table A representing the relation between step value STEP and the control signal value Vc is stored in storage unit 16, and the control signal value Vc corresponding to the step value STEPn for the next slot is read from table A. Alternatively, a function equation representing the relation between the step value STEP and a control signal value Vc may be stored in storage unit 16, and gain control unit 15 may calculate the control signal value based on the step value STEPn of the next slot and the function equation.

In the present embodiment, table B representing relation between the temperature T and a step upper limit value STEPLIM is stored in the storage unit 16, and the step upper limit value STEPLIM in accordance with the detected temperature T is read from table B. Alternatively, a function equation representing the relation between the temperature T and the step upper limit value STEPLIM may be stored in the storage unit 16, and the gain control unit 15 may calculate the step upper limit value STEPLIM based on the detected temperature T and a function equation.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A portable wireless transceiver, comprising:
a receiving unit receiving a signal from a base station;
a transmitting unit transmitting a signal to said base station with a transmission power in accordance with a control signal value;
a transmission power finding unit finding the control signal value that changes stepwise, corresponding to a transmission power request received from said base station through said receiving unit, by accessing a first table storing a relation between step values and control signal values for corresponding transmission power set values;
a limit value determining unit detecting a state of said transmitting unit and determining a limit value for said control signal value that changes stepwise based on the detected state; and
a power control unit controlling the transmission power of said transmitting unit in accordance with the control signal value found by said transmission power finding unit, and when the control signal value found by said transmission power finding unit exceeds the limit value of said limit value determining unit, controlling the transmission power of said transmitting unit in accordance with said limit value to not exceed said limit value.

2. The portable wireless transceiver according to claim 1, wherein said limit value determining unit determines the limit value for said control signal value that changes stepwise, based on temperature of said transmitting unit.

3. The portable wireless transceiver according to claim 2, wherein said limit value determining unit determines the limit value for said control signal value that changes stepwise, based on the temperature of said transmitting unit and a temperature-limit value table.

4. The portable wireless transceiver according to claim 2, wherein
said limit value determining unit determines the limit value for said control signal value that changes stepwise, based on the temperature of said transmitting unit and a temperature-limit relation expression.

5. A portable wireless transceiver, comprising:
a receiving unit receiving a signal from a base station;
a transmitting unit transmitting a signal to said base station with a transmission power in accordance with a control signal value;
a transmission power finding unit finding the control signal value that changes stepwise, corresponding to a transmission power request received from said base station through said receiving unit, by accessing a first table storing a relation between step values and control signal values for corresponding transmission power set values;
a limit value determining unit detecting a state of said transmitting unit and determining a limit value for said control signal value that changes stepwise based on the detected state, by accessing a second table storing for different temperature values upper limits of the step values; and
a power control unit controlling the transmission power of said transmitting unit in accordance with the control signal value found by said transmission power finding unit, and when the control signal value found by said transmission power finding unit exceeds the limit value of said limit value determining unit, controlling the transmission power of said transmitting unit in accordance with said limit value to not exceed said limit value.

6. The portable wireless transceiver according to claim 5, wherein said limit value determining unit determines the limit value for said control signal value that changes stepwise, based on temperature of said transmitting unit.

* * * * *